(12) United States Patent
Johansson et al.

(10) Patent No.: US 8,009,070 B2
(45) Date of Patent: Aug. 30, 2011

(54) COMPENSATION OF MISMATCH ERRORS IN A TIME-INTERLEAVED ANALOG-TO-DIGITAL CONVERTER

(75) Inventors: Håkan Johansson, La Jolla, CA (US); Per Löwenborg, Linköping (SE)

(73) Assignee: Signal Processing Devices Sweden AB, Linköping (SE)

( * ) Notice: Subject to any disclaimer, the term of this patent is extended or adjusted under 35 U.S.C. 154(b) by 0 days.

(21) Appl. No.: 12/665,449

(22) PCT Filed: Jun. 21, 2007

(86) PCT No.: PCT/SE2007/050455
§ 371 (c)(1), (2), (4) Date: Dec. 18, 2009

(87) PCT Pub. No.: WO2008/156400
PCT Pub. Date: Dec. 24, 2008

(65) Prior Publication Data
US 2010/0182174 A1    Jul. 22, 2010

(51) Int. Cl.
*H03M 1/06* (2006.01)
(52) U.S. Cl. ........................... 341/118; 341/155
(58) Field of Classification Search ............... 341/118, 341/155, 120, 141, 152, 161; 375/350, 219
See application file for complete search history.

(56) References Cited

U.S. PATENT DOCUMENTS

| | | | |
|---|---|---|---|
| 7,049,992 B1 * | 5/2006 | Hilton | 341/155 |
| 2004/0174284 A1 | 9/2004 | Pupalaikis | |
| 2006/0279445 A1 | 12/2006 | Kinyua et al. | |
| 2007/0069937 A1 | 3/2007 | Balakrishnan et al. | |

OTHER PUBLICATIONS

Stefan Mendel, et al., "A Compensation Method for Magnitude Response Mismatches in Two-channel Time-interleaved Analog-to-Digital Converters," Proc. IEEE Int. Conf. Electronics, Circuits, Syst., Nice, France, Dec. 2006, pp. 712-715.
Tsung-Heng Tsai, et al., "Bandwidth Mismatch and Its Correction in Time-Interleaved Analog-to-Digital Converters," *IEEE Transactions on Circuits and Systems—II: Express Briefs*, vol. 53, No. 10, pp. 1133-1137, Oct. 2006.
Stefan Mendel et al., On the Compensation of Magnitude Response Mismatches in M-channel Time-Interleaved ADCs, In Proc. IEEE Int. Symp. Circuits, Syst., New Orleans, May 2007, pp. 3375-3378.
Munkyo Seo, et al., Comprehensive Digital Correction of Mismatch Errors for a 400-Msamples/s 80-dB SFDR Time-Interleaved Analog-to-Digital Converter, *IEEE Transactions on Microwave Theory and Techniques*, vol. 53, No. 3, pp. 1072-1082, Mar. 2005.
Seo et al., Generalized Blind Mismatch Correction for Two-Channel Time-Interleaved A-to-D Converters, IEEE Trans. Microwave Theory Techniques, vol. 53, No. 3, pp. 1072-1082, Mar. 2005.
International search report, issued in counterpart application PCT/SE2007/050455, Jun. 12, 2008.
Written opinion of the international searching authority, issued in counterpart application PCT/SE2007/050455, Jun. 12, 2008.

* cited by examiner

*Primary Examiner* — Joseph Lauture
(74) *Attorney, Agent, or Firm* — Venable LLP; Eric J. Franklin

(57) ABSTRACT

A method for the compensation of frequency-response mismatch errors in M-channel time-interleaved ADCs. The compensation is done through an M-periodic time-varying filter $h_n(k)=h_{n\,mod\,M}(k)$ (2), or, equivalently, a set of M time-invariant filters $h_n(k)$, $n=0, 1, \ldots, M-1$. The overall compensation system is constructed by determining the M filter impulse responses $h_n(k)$ through M separate matrix inversions, where the size of the matrices equals the filter impulse response length. Also, a compensated M-channel time-interleaved ADC based on and performing the method.

23 Claims, 1 Drawing Sheet

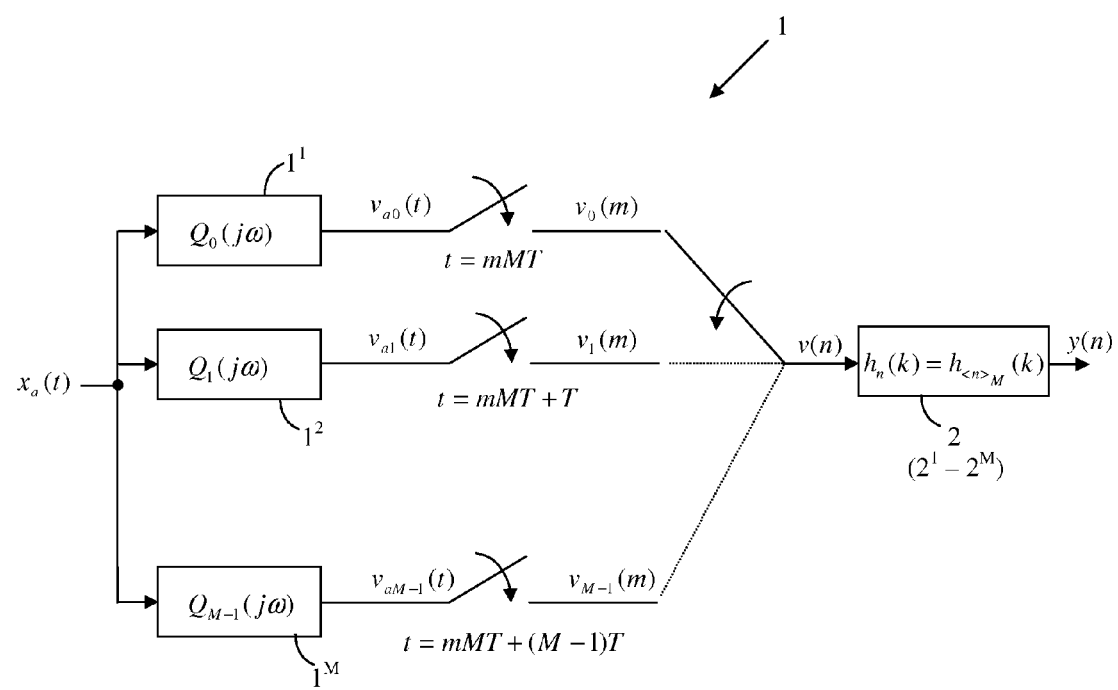
Fig.

COMPENSATION OF MISMATCH ERRORS IN A TIME-INTERLEAVED ANALOG-TO-DIGITAL CONVERTER

CROSS-REFERENCE TO RELATED APPLICATIONS

This application is the national phase under 35 U.S.C. §371 of PCT/SE2007/050455 filed 21 June 2007.

TECHNICAL FIELD

The present invention relates generally to a method and an apparatus for digital signal processing, and more particularly to a method for compensation of frequency response mismatch errors in a time-interleaved Analog-to-Digital converter array and an apparatus performing the method.

BACKGROUND OF THE INVENTION

The shift from analog signal processing (ASP) to digital signal processing (DSP) lies behind the tremendous development of information processing systems that are used today. For example, DSP has enabled the fast growth of mobile communication systems and has opened up for new sophisticated medical aids, just to mention a couple of important applications. The foremost advantages of DSP over ASP are its robustness and that it can perform functions with arbitrary precision. The trend during the past decades has therefore been to use as little ASP as possible and to replace analog functions with the corresponding digital functions. The real world is however analog by nature which means that the need for ASP cannot be eliminated completely. In particular, it will always be necessary to use analog-to-digital converters (ADCs) and digital-to-analog converters (DACs), whenever there is a desire to communicate with other human beings or machines. The present document is concerned with ADCs.

During the past decades, the research and development of ADCs have been quite intensive, both in academia and industry. Nevertheless, it is foreseen that ADCs will remain key components as well as bottlenecks in many contexts of tomorrow. For example, it can be envisaged that an ADC capable of a sampling rate of more than 100 MHz and 17 bits resolution is required in fourth-generation communication systems. This is beyond the state-of-the art ADCs which can manage only some 13-14 effective bits of resolution at this rate. It is therefore vital to continue to invent new ADCs principles, techniques, and architectures to improve the performance of the AD conversion.

ADCs can be categorized into different classes depending on the underlying principle of the conversion process. This paper concerns a principle referred to as time-interleaved ADCs which utilizes interleaving of multiple ADCs to increase the effective sampling rate.

A time-interleaved ADC array is commonly used when a single ADC is not capable of meeting the needed sampling rate while providing desired conversion resolution. A time-interleaved ADC (TI-ADC) array comprises a plurality of ADCs arranged in parallel fashion with a signal to be converted being provided to each ADC of the plurality of ADCs in the array. Each ADC is responsible for converting only a portion of the signal and can therefore perform the conversion at a slower rate. For example, if a TI-ADC array has an integer number of M ADCs arranged in parallel fashion, then each of the M number of ADCs is only required to convert the signal at 1/M-th of the desired sampling rate.

Rather than having a single high conversion rate, high resolution ADC that is capable of converting an analog signal at a sampling rate, $f_s$, the TI-ADC array makes use of M ADCs arranged in parallel configuration. Each of the ADCs has a sampling rate of $f_s/M$. Therefore the sampling rate of the ADCs can be significantly lower than the sampling rate, $f_s$ of the overall TI-ADC array. With the lower sampling rate, cheaper ADCs can be used, ADCs with a higher conversion resolution can be used and the sampling rate of the TI-ADC array can be pushed higher.

Each of the M ADCs needs to operate at a sampling rate of $f_s/M$. Once every $M \cdot T$ seconds, wherein T is an inverse of the sampling frequency, $f_s$, the demultiplexer couples an input of an ADC to the input signal. Each signal path containing an ADC can be referred to as a channel.

A multiplexer can be used to recombine outputs from the M ADCs back to a single output stream, a digital signal stream made up of digitized samples of the output signal. The output signal from the TI-ADC comprises a sequence of digitized samples, one every T seconds, with a number of bits in each digitized sample being determined by a conversion resolution of the M ADCs. The multiplexer changes a coupling between an output of one of the M ADCs to the output signal from the TI-ADC at a frequency that is substantially equal to the sampling rate.

By use of an M-channel time-interleaved ADC, the effective sampling rate is increased by a factor of M, but the resolution of the individual channel converters is unfortunately not maintained in the overall converter due to channel mismatch errors. To restore the resolution, it is therefore necessary to compensate for these errors. Up to a certain resolution, it is enough to compensate for static gain, and linear-phase (time-skew) errors (There also exist static offset mismatch errors but they are independent of signal transfer characteristics and are easy to compensate for). Several techniques for this purpose have been proposed over the last decades. However, to reach a very high resolution (more than some 12 bits) for high-speed conversion (above some 100 Megasamples/s), account has to be taken into that the different channel ADCs are essentially lowpass filters with different frequency responses, thus with different phase responses as well as magnitude responses. To reach a very high resolution, it is necessary to suppress these frequency response mismatch errors, not only the static gain and linear-phase parts which is enough for a first-order approximation of the channel frequency responses. Up to now, only a few papers have addressed the more general problem. Some of these papers, herein referred to as general prior art, and in their entirety incorporated into this description, are:

[1] T. Tsai, P. J. Hurst, and S. H. Lewis, "Bandwidth mismatch and its correction in time-interleaved analog-to-digital converters,", IEEE Trans. Circuits Syst. II, vol. 53, no. 10, pp. 1133-1137, October 2006.

[2] M. Seo, M. J. W. Rodwell, and U. Madhow, "Comprehensive digital correction of mismatch errors for a 400-Msamples/s 80-db SFDR time-interleaved analog-to-digital converter,", IEEE Trans. Microwave Theory Techniques, vol. 53, no. 3, pp. 1072-1082, March 2005.

[3] S. Mendel and C. Vogel, "A compensation method for magnitude response mismatches in two-channel time-interleaved analog-to-digital converters," in Proc. IEEE Int. Conf. Electronics, Circuits, Syst., Nice, France, December 2006.

[4] S. Mendel and C. Vogel, "On the compensation of magnitude response mismatches in M-channel time-interleaved ADCs.", in Proc. IEEE Int. Symp. Circuits, Syst., New Orleans, USA, 2007 May.

The references [1]-[4] disclose use of compensation filters connected to the output of the channels of the TI-ADC. In reference [1], M synthesis filters are designed separately by use of a technique that approximates the desired filter frequency responses utilizing windowing techniques. Such design is known to result in suboptimum filters as they are based on truncation and weighting of ideal impulse responses instead of optimization. Reference [2] discloses a design with optimum filters based on least squares, wherein the filters are designed in terms of M synthesis filters, which are designed simultaneously by inverting one matrix of size M times the filter impulse response length.

A somewhat different compensation technique, that also utilizes separately designed filters, is disclosed in references [3] and [4], but the technique presented therein requires additional cosine and sine modulators which increases the implementation cost for the compensation system. Furthermore, references [3] and [4] only treat magnitude response mismatch errors of frequency response mismatch errors.

Other documents relating to methods for performing compensation of mismatch errors in time-interleaved ADC arrays are, e.g. US 2006/0279445 and US 2007/0069937. The method in the former of these cited documents suggests adjusting a delay imparted on a sampling clock by an adjustable delay in each channel. The second of the cited documents suggests the use of a reference ADC, by means of which a timing error is generated for use as a change of the phase of the sampling clock provided to the ADC and to estimate gain and DC offset errors for modifying values of reference voltages applied to the converter. The disclosures of said patent documents thus present solutions to problems as discussed in paragraph [0009].

SUMMARY OF THE INVENTION

One aspect of the present invention is to introduce a compensation method for the frequency-response mismatch errors in M-channel time-interleaved ADCs. The compensation is done utilizing a set of M time-invariant filters $h_r(k)$, r=0, 1, . . . , M−1. The overall compensation system is constructed by determining the M filter impulse responses $h_r(k)$ through M separate matrix inversions, where the size of the matrices equals the filter impulse response length. Alternatively and equivalently the compensation is done through an M-periodic time-varying filter $h_n(k)=h_{n \bmod M}(k)$. The invention further provides a compensated M-channel time-interleaved ADC based on and performing said method.

According to one aspect of the invention a method with the characteristics of the appended claim 1 is presented.

According to a further aspect of the invention a method with the characteristics of the enclosed apparatus claim is presented.

Further aspects and embodiments of the invention are presented in the dependent claims.

Using the design technique as provided by this invention (or that in reference [2]), optimum filters are obtained in the least-squares sense. Specifically, there is assumed here a slight oversampling, whereby the filters are optimized with respect to the frequency band of interest, which yields better results (smaller approximation error and/or lower filter orders) than those obtained with windowing-based techniques. The solution presented according to the invention offers an alternative to the technique in reference [2], where the design problem is expressed in terms of M synthesis filters (which do not coincide with the M time-invariant filters of the present invention) that are designed simultaneously by inverting one matrix of size M times the filter impulse response length.

A somewhat different compensation technique, that also utilizes separately designed filters, was introduced and discussed in references [3] and [4], but the technique presented therein requires additional cosine and sine modulators which increases the implementation cost of the compensation system. Furthermore, references [3] and [4] only treat magnitude response mismatch errors, whereas the design technique according to the present invention can handle general complex-valued frequency response mismatch errors.

The problem to be solved by means of the present invention is discussed in the following, whereas the solution is presented more in detail in the embodiments of invention below.

A start is a continuous-time signal $x_a(t)$ that is bandlimited to $\omega_0 < \pi/T$. In this case, the Nyquist criterion for uniform sampling with a sampling frequency of 1/T without aliasing is fulfilled. That is, sampling according to $x(n)=x_a(nT)$ does not introduce aliasing which means that we have in the frequency domain $$X(e^{j\omega T}) = \frac{1}{T} X_a(j\omega), \quad (1)$$

wherein $X(e^{j\omega T})$ and $X_a(j\omega)$ denote the Fourier transforms of the uniform-sampling sequence x(n) and the continuous-time signal $x_a(t)$, respectively. This means that $x_a(t)$ can be recovered from x(n).

In an M-channel time-interleaved ADC, without correction, we do not obtain the desired uniform sequence x(n) but instead another sequence, herein called v(n), through interleaving of $v_r(m)$, r=0, 1, . . . , M−1, according to $$v(n)=v_{<n>_M}(\lfloor n/M \rfloor), \quad (2)$$

where $\lfloor x \rfloor$ denotes the integer part of x, $$<n>_M=n \bmod M, \quad (3)$$

and $v_r(m)$ are the sequences generated by the M channel ADCs, see the FIGURE explained below. Assuming that these ADCs are modeled as linear and time-invariant filters with frequency responses $Q_r(j\omega)$, the common input $x_a(t)$, and outputs $v_{ar}(t)$, $v_r(m)$ are given by $$v_r(m)=v_{ar}(mMT+rT). \quad (4)$$

The problem to be solved can now be formulated as follows. Given the sequence v(n) in (2), form a new sequence y(n) that is an approximation of the sequence $x(n)=x_a(nT)$. A solution of this is presented more in detail in the embodiments of the invention.

BRIEF DESCRIPTION OF THE DRAWING

The FIGURE shows an M-channel time-interleaved ADC (TI-ADC) 1 with different channel frequency responses $Q_r(j\omega)$, r=0, 1, . . . , M−1, and an M-periodic time-varying compensation filter 2 with impulse response $h_n(k)=h_{<n>_M}(k)$.

DESCRIPTION OF EMBODIMENTS

Below the invention will be explained in greater detail by description of embodiments with reference to the accompanying drawing.

The proposed compensation method comprises four main steps as follows.

Step 1: Determine the M frequency responses $Q_r(j\omega)$, r=0, 1, ..., M−1.

Step 2: Determine the M impulse responses $h_r(n)$, r=0, 1, ..., M−1 separately by minimizing in some sense M corresponding suberror sequences $e_r(m)$, where each suberror sequence is the difference between an output subsequence $y_r(m)$ and a corresponding desired uniform subsequence $x_r(m)=x_a(mMT+rT)$ which contains the desired uniform samples for the time instances t=mMT+rT.

Step 3: Form the M output subsequences $y_r(m)$ through convolution between the corresponding impulse responses $h_r(n)$ and v(n), the latter sequence being obtained by interleaving the M channel ADC outputs $v_r(m)$.

Step 4: Form the overall output by interleaving the output subsequences $y_r(m)$ according to $$y(n)=y_{<n>_M}(\lfloor n/M \rfloor). \quad (5)$$

In Step 1, the M frequency responses $Q_r(j\omega)$ can either be obtained through measurement on a dense enough grid of frequency points $j\omega$ or by first assuming a finite-order polynomial model of each $Q_r(j\omega)$ and then using estimation techniques to determine the parameters of the M polynomials.

In Step 2, the M impulse responses $h_r(n)$ can either be of infinite length or finite length but from a practical implementation point of view, they are preferably of finite length in which case the subsequence errors $e_r(m)$ to be minimized can be expressed as $$e_r(m) = \frac{1}{2\pi}\int_{-\omega_0 T}^{\omega_0 T}(A_r(j\omega)-1)X(e^{j\omega T})e^{j\omega T(nM+r)}d(\omega T), \quad (6)$$

wherein $$A_r(j\omega) = \sum_{k=-N}^{N} h_r(k) Q_{<r-k>_M}(j\omega)e^{-j\omega Tk}. \quad (7)$$

As seen above, the subsequence error $e_r(m)$ is reduced by a reduction of the "size" of $A_r(j\omega)-1$. Minimization of $e_r(m)$ can be done in many different ways, e.g. in the minimax or least-squares senses, but from the practical implementation point of view it is preferred to minimize $e_r(m)$ in the least-squares sense because the corresponding impulse response can then be determined analytically though matrix inversion. Specifically, for this purpose, we minimize the error power functions $P_r$, r=0, 1, ..., M−1 given by (8) (Note: It is also possible to include a weighting function in in order to take the input signal spectrum into account according to prior art). However, when the input spectrum is flat, it is appropriate to set this weighting function to unity which is done here. The weighting function is therefore omitted here to keep the notation as simple as possible).

$$P_r = \frac{1}{2\pi}\int_{-\omega_0 T}^{\omega_0 T}|A_r(j\omega)-1|^2 d(\omega T), \quad (8)$$

which can be rewritten in matrix form as $$P_r = h_r^T S_r h_r + c_r^T h_r + C, \quad (9)$$

wherein $$h_r = [h_r(-N) h_r(-N+1) \ldots h_r(N)]^T \quad (10)$$

and $$c_r = [c_{r,-N} c_{r,-N+1} \ldots c_{r,N}]^T, \quad (11)$$

with $c_{r,k}$, k=−N,−N+1, ..., N, being $$c_{r,k} = \quad (12)$$
$$-\frac{1}{\pi}\int_{-\omega_0 T}^{\omega_0 T}|Q_{<r-k>_M}(j\omega)| \times \cos(-\omega Tk + \arg\{Q_{<r-k>_M}(j\omega)\})d(\omega T).$$

Further, $S_r$ are 2N+1×2N+1 symmetric and positive definite matrices with entries $s_{r,kp}$, k, p=−N,−N+1, ..., N given by $$s_{r,kp} = \quad (13)$$
$$-\frac{1}{\pi}\int_{-\omega_0 T}^{\omega_0 T}|Q_{<r-k>_M}(j\omega)||Q_{<r-k>_M}(j\omega)| \times \cos(\omega T(p-k) +$$
$$\arg\{Q_{<r-k>_M}(j\omega)\} + \arg\{Q_{<r-p>_M}(j\omega)\})d(\omega T).$$

Finally, the constant C is given by $$C = \frac{\omega_0 T}{\pi}. \quad (14)$$

For each r, the values of $h_r(k)$ that minimize the corresponding function $P_r$ is obtained by setting the partial derivatives of $P_r$ with respect to $h_r(k)$ to zero and solving for $h_r(k)$. With $P_r$ in the form of (9), the solution to this problem is immediately obtained as $$h_r = -0.5 S_r^{-1} c_r. \quad (15)$$

The integrals in (12) and (13) are computed numerically using the result from Step 1.

In Step 3, the output subsequence $y_r(m)$ is formed as $$y_r(m) = \sum_{k=-N}^{N} v(mM+r-k) h_r(k), \quad (16)$$

wherein $h_r(k)$ is the impulse response of a non-causal 2N th order M-periodic time-varying FIR filter (Note: In practice, a casual filter is obtained by delaying the non-casual filter N samples. Further, herein, even-order filters are assumed for simplicity. However, odd-ordered filters can be handled as well by modifying the summation index range in (16)).

In Step 4, the output subsequences are interleaved to form the overall output. There are several orders in which the output subsequences $y_r(m)$ can be computed and finally appropriately interleaved. However, in a practical real-time system, the $y_r(m)$'s samples are computed when the corresponding channel ADC outputs $v_r(m)$ arrive. The proposed compensation system can therefore be implemented by feeding the interleaved sequence v(n) to a time-varying filter with the M-periodic impulse response $h_n(k)=h_{<n>_M}(k)$, as seen in the FIGURE. However, it is obvious that such a time-varying filter can also be implemented as a multirate (M-rate) synthesis filter bank where the channel sequences $v_r(m)$ are first upsampled by M and then fed into time-invariant synthesis filters whose outputs are added to form the overall output y(n). This is because it is always possible to start with one representation and derive the other one using multirate filter bank theory as known in the art. In the final implementation, the channel output sequences are then fed into polyphase subfilters that work at the lowest sample rate, 1/(MT), and whose outputs are properly combined and interleaved to form the overall output. Each synthesis filters impulse response values are obtained through a simple allocation of impulse response values from the M impulse responses $h_r(k)$, and each synthesis filter contains impulse response values from all of $h_r(k)$.

In the previous section, the compensation filters were designed to make the overall output y(n) to approximate the uniform-sequence $x(n)=x_a(nT)$. However, in many cases, it is possible to allow a small linear distortion of the overall ADC. This is obtained if the filters instead are designed in such a way that all channel outputs after the compensation experience the same frequency response, say $Q_{des}(j\omega)$. This is done by determining the impulse responses $h_r(k)$ so that $A_r(j\omega)$ approximate $Q_{des}(j\omega)$ instead of unity. For this purpose, the same technique as previously can be used, but with $Q_r(j\omega)$ replaced by $Q_r(j\omega)/Q_{des}(j\omega)$. This affects Step 1 and Step 2 in the proposed four-step compensation method whereas Step 3 and Step 4 remain the same.

In Step 1, $Q_r(j\omega)/Q_{des}(j\omega)$ can be determined by first determining all $Q_r(j\omega)$, then selecting the desired response $Q_{des}(j\omega)$, and finally dividing all $Q_r(j\omega)$ by $Q_{des}(j\omega)$. Alternatively, $Q_r(j\omega)/Q_{des}(j\omega)$ can be determined directly in the measurement or in an estimation procedure. The latter approach is preferable in practice because the former one requires a known input signal. Further, the latter approach has been proposed in prior art for a two-channel case but can easily be extended to arbitrary M.

When the desired function $Q_{des}(j\omega)$ is chosen as one of the $Q_r(j\omega)$, say $Q_{des}(j\omega)=Q_{r_{ref}}(j\omega)$ $r_{ref}\in[0, 1, \ldots, M-1]$, the output subsequences $y_r(m)$ approximate $v_{a_{ref}}(mMT+rT)$. The overall design problem can here be relaxed for two reasons. First, the impulse response $h_{r_{ref}}(k)$, corresponding to $A_{ref}(j\omega)$ becomes $h_{r_{ref}}(k)=\delta(k)$, where $\delta(k)$ is the unit impulse sequence. This is obvious as the corresponding channel's samples are already the desired ones. In this way, the need for one of the compensation filters has been removed. Secondly, the requirements on the remaining filters may be relaxed which leads to a reduced filter complexity both from the design and implementation points of view. This is because the "distances" between unity and the frequency responses $Q_r(j\omega)$ may be larger than the "distances" between $Q_{r_{ref}}(j\omega)$ and the remaining $Q_r(j\omega)$.

Although the problem can be relaxed by the selection $Q_{des}(j\omega)=Q_{r_{ref}}(j\omega)$, it is possible to think of situations where it is desired to choose $Q_{des}(j\omega)$ differently. For example, if there is a need to perform channel equalization after the ADC in a communication system, one can incorporate the channel frequency response preceding the ADC into $Q_{des}(j\omega)$. The ADC compensation filters and equalizer can then be combined which eliminates the need for an additional equalization filter after the ADC compensation system.

The illustrated and described embodiments should only be referred to as an example. Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly stated here, that the converters described in each channel could be constructed as one unit or in separate units.

The invention claimed is:

1. A method for compensating frequency response mismatch errors in an M-channel time-interleaved analog-to-digital converter comprising M analog-to-digital converters ($1^1$-$1^M$) in an array and a filter connected to the output of the time-interleaved analog-to-digital converter, the method comprising:
   determining M frequency responses $Q_r$ from said M-channels, calculating separately M channel impulse responses $h_r$ for said M-channels, calculating matrix elements of M matrices $S_r$ and vectors $c_r$ being factors of error power functions $P_r$;
   minimizing said power functions $P_r$ by inverting separately said M matrices $S_r$;
   forming M output subsequences utilizing convolutions of the impulse responses being calculated separately and the output of the time-interleaved analog-to-digital converter, and
   forming an overall output from the compensated time-interleaved analog-to-digital converter by interleaving output subsequences $y_r$ of the channels.

2. The method according to claim 1, further comprising:
   performing said compensation utilizing an M-periodic time-varying filter $h_n(k)=h_{n \bmod M}(k)$, or equivalently utilizing a set of M time-invariant filters $h_r(k)$, $r=0$, $1, \ldots, M-1$, wherein $h_r(k)$ are the M separately calculated impulse responses.

3. The method according to claim 2, wherein said calculation of said M impulse responses, $h_r(n)$ $r=0, 1, \ldots, M-1$, includes:
   minimizing suberror sequences $e_r(m)$ being the differences between the corresponding output subsequences $y_r(m)$ and desired uniform subsequences $x_r(m)=x_a(mMT+rT)$ containing desired uniform samples for the time instances $t=mMT+rT$.

4. The method according to claim 3, further comprising:
   minimizing subsequence errors $e_r(m)$ wherein:

$$e_r(m) = \frac{1}{2\pi}\int_{-\omega_0 T}^{\omega_0 T}(A_r(jw)-1)X(e^{j\omega T})e^{j\omega T(mM+r)}\,d(\omega T),$$

wherein $$A_r(j\omega) = \sum_{k=-N}^{N} h_r(k)Q_{<r-k>_M}(j\omega)e^{-j\omega Tk}.$$

5. The method according to claim 3, further comprising:
   the size of said matrices being equal to the filter impulse response length.

6. The method according to claim 2, further comprising:
   forming said output subsequences $y_r(m)$ using the convolution formula:

$$y_r(m) = \sum_{k=-N}^{N} v(mM+r-k)h_r(k); r=0, 1, \ldots, M-1,$$

wherein $h_r(k)$ is the impulse response of a non-casual 2Nth order M-periodic time varying FIR-filter (Finite-length Impulse Response) $h_n(k)=h_{<n>_M}(k)$.

7. The method according to claim 6, further comprising:
   forming said overall output from the compensated time-interleaved analog-to-digital converter by interleaving the output subsequences $y_r(m)$ according to: $y(n)=y_{<n>_M}(\lfloor n/M \rfloor)$.

8. The method according to claim 6, further comprising:
computing $y_r(m)$-samples when the corresponding analog-to-digital converter outputs $v_r(m)$ arrive.

9. The method according to claim 6, further comprising:
providing an M-rate synthesis filter bank of time-invariant synthesis filters ($2^1$-$2^M$), wherein channel sequences $v_r(m)$ are upsampled by M and then fed into said filters, the outputs of which are added to form the overall output $y(n)$.

10. The method according to claim 1, further comprising:
denoting a desired frequency response by $Q_{des}(j\omega)$, and setting $Q_{des}(j\omega)=1$.

11. The method according to claim 10, further comprising:
determining frequency responses $Q_r(j\omega)$ r=0, 1, ..., M−1, in each analog-to-digital converter ($1^1$-$1^M$) of the M channels performed by any one of:
a measurement of grid frequency points,
predetermining a finite-order polynomial model of each $Q_r(j\omega)$ followed by a determination of parameters of M polynomials representative of the frequency response of the respective channel.

12. The method according to claim 1, further comprising:
minimizing error power functions $P_r$, r=0, 1, ..., M−1, written in matrix form as:

$$P_r = h_r^T S_r h_r + c_r^T h_r + C,$$

wherein $$h_r = [h_r(-N) h_r(-N+1) \ldots h_r(N)]^T$$

and $$c_r = [c_{r,-N} c_{r,-N+1} \ldots c_{r,N}]^T,$$

with $c_{r,k}$, k=−N, −N+1, ..., N, being $$c_{r,k} = -\frac{1}{\pi} \int_{-\omega_0 T}^{\omega_0 T} |Q_{<r-k>_M}(j\omega)| \times \cos(-\omega T k + \arg\{Q_{<r-k>_M}(j\omega)\}) d(\omega T)$$

wherein $S_r$ are 2N+1×2N+1 symmetric and positive definite matrices with entries $s_{r,kp}$, p=−N, −N+1, ..., N given by $$s_{r,kp} = -\frac{1}{\pi} \int_{-\omega_0 T}^{\omega_0 T} |Q_{<r-k>_M}(j\omega)| |Q_{<r-p>_M}(j\omega)| \times$$
$$\cos(\omega T(p-k) + \arg\{Q_{<r-k>_M}(j\omega)\} + \arg\{Q_{<r-p>_M}(j\omega)\}) d(\omega T)$$

and wherein the constant C is given by $$C = \frac{\omega_0 T}{\pi}.$$

13. The method according to claim 12, further comprising:
obtaining for each r the values of $h_r(k)$ that minimizes the corresponding function $P_r$ by setting the partial derivatives of with respect to $h_r(k)$ to zero and solving for $h_r(k)$, wherein the impulse responses $h_r$ are obtained from $$h_r = -0.5 S_r^{-1} c_r.$$

14. The method according to claim 1, further comprising:
denoting said desired frequency response by $Q_{des}(j\omega)$, and setting $Q_{des}(j\omega) = Q_{r_{ref}}(j\omega)$.

15. The method according to claim 14, further comprising:
determining frequency responses $$\frac{Q_r(j\omega)}{Q_{r_{ref}}(j\omega)},$$

wherein r=0, 1, ..., M−1, r≠$r_{ref}$ in each analog-to-digital converter ($1^1$-$1^M$) of the M channels performed by any one of:
a measurement of grid frequency points,
predetermining a finite-order polynomial model of each $$\frac{Q_r(j\omega)}{Q_{r_{ref}}(j\omega)}$$

followed by a determination of parameters of M polynomials representative of the frequency response of the respective channel.

16. The method according to claim 15, wherein said calculation of said M impulse responses, $h_r(n)$=r=0, 1, ..., M−1 includes:
minimizing suberror sequences $e_r(m)$ being the differences between the corresponding output subsequences $y_r(m)$ and desired uniform subsequences $v_{ar_{ref}}(mMT+rT)$ containing desired uniform samples for the time instances $$t = mMT + rT.$$

17. The method according to claim 16, further comprising:
minimizing subsequence errors $e_r(m)$ through:

$$e_r(m) = \frac{1}{2\pi} \int_{-\omega_0 T}^{\omega_0 T} (A_r(jw) - 1) X(e^{j\omega T}) e^{j\omega T(mM+r)} d(\omega T),$$

wherein $$A_r(j\omega) = \sum_{k=-N}^{N} h_r(k) Q'(j\omega) e^{-j\omega Tk},$$

and wherein $$Q' = \frac{Q'}{Q_{des}(j\omega)};$$

r≠$r_{ref}$; $h_{r_{ref}}(k) = \delta(k)$; $\delta(k)$=the unit impulse sequence.

18. The method according to claim 17, further comprising:
performing said determining of the M−1 filter impulse responses $h_n(k)$ through M−1 separate matrix inversions of the matrices $S_r$, where the size of the matrices equals the filter impulse response length.

19. The method according to claim 1, further comprising:
minimizing said error power functions $P_r$, r=0, 1, ..., M−1, written in matrix form as:

$$P_r = h_r^T S_r h_r + c_r^T h_r + C,$$

wherein $$h_r = [h_r(-N) h_r(-N+1) \ldots h_r(N)]^T$$

and $$c_r = [c_{r,-N} c_{r,-N+1} \ldots c_{r,N}]^T,$$

with $c_{r,k}$, $k=-N, -N+1, \ldots, N$, being $$c_{r,k} = -\frac{1}{\pi}\int_{-\omega_0 T}^{\omega_0 T} |Q'(j\omega)| \times \cos(-\omega T k + \arg\{Q'(j\omega)\}) d(\omega T)$$

wherein $S_r$ are $2N+1 \times 2N+1$ symmetric and positive definite matrices with entries $s_{r,kp}$, $k, p = -N, -N+1, \ldots, N$ given by $$s_{r,kp} = -\frac{1}{\pi}\int_{-\omega_0 T}^{\omega_0 T} |Q'(j\omega)| \, |Q'(j\omega)| \times$$
$$\cos(\omega T(p-k) + \arg\{Q_{<r-k>_M}(j\omega)\} + \arg\{Q'(j\omega)\}) d(\omega T)$$

and wherein the constant C is given by $$C = \frac{\omega_0 T}{\pi}.$$

20. The method according to claim 19, further comprising:
obtaining for each r, $r \neq r_{ref}$, the values of $h_r(k)$ that minimize the corresponding function $P_r$ by setting the partial derivatives of $P_r$ with respect to $h_r(k)$ to zero and solving for $h_r(k)$.

21. The method according to claim 1, further comprising:
feeding channel output sequences into polyphase subfilters working at lowest sample rate, 1/(MT),
combining and interleaving outputs of said subfilters for forming the overall output y(n).

22. A compensated analog-to-digital time-interleaved converter comprising:
a number of M channels,
each channel including an analog-to-digital converter ($1^1$-$1^M$), and
a filter ($2^1$-$2^M$),
wherein the converter is configured to perform a method for compensating frequency response mismatch errors in the converter comprising
determining M frequency responses $Q_r$ from said M-channels,
calculating separately M channel impulse responses $h_r$ for said M-channels,
calculating matrix elements of M matrices $S_r$ and vectors $c_r$ being factors of error power functions $P_r$,
minimizing said power functions $P_r$ by inverting separately said M matrices $S_r$,
forming M output subsequences utilizing convolutions of the impulse responses being calculated separately and the output of the interleaved analog-to-digital converter, and
forming an overall output from the compensated interleaved analog-to-digital converter by interleaving output subsequences $y_r$ of the M channels.

23. The compensated analog-to-digital converter of claim 22, wherein said filter ($2^1$-$2^M$) is one of:
an M-periodic time-varying filter $h_n(k) = h_{n \bmod M}(k)$,
a set of M time-invariant filters $h_r(k)$, $r=0, 1, \ldots, M-1$,
an M-rate synthesis filter bank of time-invariant synthesis filters ($2^1$-$2^M$), or
a set of polyphase subfilters working at lowest sample rate, 1/(MT).

* * * * *